March 2, 1971 L. L. KUIPER 3,567,509

METAL-INSULATOR FILMS FOR SEMICONDUCTOR DEVICES

Original Filed July 22, 1965

PRESENT METHOD

ALTERNATIVE METHOD
DEPOSITIONS BEFORE GLASSING

INVENTOR.
LUBERTUS L. KUIPER
BY Harry M Weiss
ATTORNEY

United States Patent Office 3,567,509
Patented Mar. 2, 1971

3,567,509

METAL-INSULATOR FILMS FOR SEMICONDUCTOR DEVICES

Lubertus L. Kuiper, Fishkill, N.Y., assignor to International Business Machines Corporation, Armonk, N.Y.
Original application July 22, 1965, Ser. No. 474,074. Divided and this application Feb. 19, 1968, Ser. No. 739,993
Int. Cl. H01l 9/00
U.S. Cl. 117—217 2 Claims

ABSTRACT OF THE DISCLOSURE

This is a metal-insulating compound film for semiconductor devices wherein the metal is a metal-semiconductor alloy with the semiconductor being a small percentage of the alloy.

This application is a division of co-pending application Ser. No. 474,074, filed July 22, 1965, now U.S. Pat. 3,382,568.

BACKGROUND OF THE INVENTION

Field of the invention

This invention relates generally to metal-insulator films for semiconductors and more particularly to a glass-metal alloy-silicon dioxide compound film for silicon semiconductor devices.

In the fabrication of silicon devices, with aluminum lands, some surface passivations of silicon planar devices, e.g., glass coating, require heat exposure of the device to a temperature just below the silicon-aluminum eutectic temperature. Under some conditions, silicon from the wafer will be dissolved in the aluminum at a temperature as much as 15° below the eutectic temperature, thereby resulting in higher land resistances and an unreliable device.

One hypothesis is that a stress mechanism between $SiO_2$ and Si plays a part in this effect. Aluminum and silicon in intimate contact form a eutectic, a liquid alloy, at approximately 577° C. and therefore, glassing is restricted to temperatures below 577° C. When a silicon device has lands running from a contact hole in the oxide to a distant point on the oxide over the oxide, and the device is glassed at 570° C., problems arise at the stepdown where the aluminum contact stripe traverses from the oxide to the silicon. The problems are phenomena such as "necking down" or breaking of the stripe and deep vertical or lateral penetrations of the silicon by the aluminum. The electrical consequences of such behavior are, in the former instance, high resistance points which burn out and open under electrical load, or in the latter case, short circuiting of the junction. The foregoing shortcomings are overcome according to the present invention by evaporating a small amount of silicon with the aluminum during the evaporation step for the formation of conductors, contacts and lands on the silicon device. It is required that the silicon be evaporated quite close to the plane of aluminum-silicon contact. The small amounts of silicon thus mixed with the aluminum prevent subsequent diffusion of further amounts of silicon into the aluminum lands, lines and stepdown portions therebetween. Although the contact resistance is slightly greater than that of a pure aluminum contact, the increase is small and a predictable value.

SUMMARY OF THE INVENTION

Accordingly, it is an object of the present invention to provide metal insulator-films for electronic devices.

Another object of the invention is to provide a technique for depositing aluminum lands on a silicon device in such a fashion that subsequent glassing will not cause the silicon of the device to be dissolved into the aluminum and an exchange in the other direction also.

An object of the invention is to provide an improved method of evaporating aluminum on a silicon device comprising the evaporation of a small amount of silicon during the aluminum evaporation.

A further object of the invention is to furnish an advanced method of evaporating a 2–3% proportion by weight of silicon with aluminum to furnish a conduction line or layer on a silicon device, said silicon being evaporated close to the aluminum-silicon interface in the range of a distance of 300–1500 A.

Another object of the invention is the provision of a glass coated silicon device with embedded aluminum conductor lines and lands over an oxide pattern, said aluminum being a prepassivated alloy of aluminum and silicon.

Another object of the invention is the provision of improved contacts to silicon devices, said contacts being adapted for processes involving heating for longer times and/or at higher temperatures than heretofore.

Another object of the invention is the provision of alternative control in the process of co-deposition of contact aluminum and silicon disclosed herein. The alternative process comprises comparatively early and fast deposition of the silicon over a land area and adjacent oxide, resulting in a discrete layer of silicon or silicon rich alloy between a flash aluminum film and a second bulk aluminum layer. This causes the sandwiching of a layer of silicon between two pure aluminum layers for subsequent diffusion of silicon into the contact aluminum prior to and during passivation to form an alloy without causing dissolution of silicon from the device proper. Thus there is later prevented an exchange of elements with the underlying land area upon passivation, because the need is satisfied from the prearranged plural aluminum silicon contact laminations.

An object is also the provision of an ohmic contact of an aluminum silicon alloy to a silicon device.

A still further object of the invention is the provision of conductor terminal lines of an alloy of 97–98% aluminum and 2–3% silicon embedded between patterns and coatings of $SiO_2$ on a silicon semiconductor device.

The foregoing and other objects, features and advantages of the invention will be apparent from the following more particular description of preferred embodiments of the invention as illustrated in the accompanying drawing.

DESCRIPTION OF THE PREFERRED EMBODIMENTS

Figure 1:
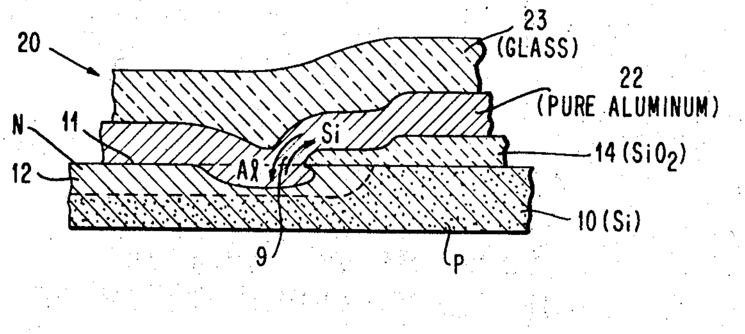
FIG. 1 PRIOR ART
FIG. 1 shows a detailed sectional view of a planar silicon device of the prior art showing the difficulties attendant in producing a pure aluminum ohmic contact thereon.

For further reference to prior art techniques for forming glass layers and other layers, the processes taught in a patent and co-pending application assigned to common assignee are U.S. Pat. No. 3,247,428, Ser. No. 141,669, filed Sept. 29, 1961, now U.S. 3,247,428 and patent application Ser. No. 291,322, filed June 28, 1963, now U.S. 3,429,029.

Briefly, the present method of attaching electrical connections to silicon planar surfaces comprises the step of co-depositing or evaporating a small amount of silicon close to the silicon device surface at the time of evaporating an aluminum film on the surface for the conductive connections. Thus there is prevented the aluminum conductor land diffusion exchange problem which arises during the glassing of devices such as transistors.

The problem to be overcome is peculiar mainly to transistors which have aluminum conductor lands extending from the contact holes to remote areas over the oxide coating on the doped silicon surface. The difficulty is not so pronounced in the cases of diodes or transistors without extended land areas. The specific problem site is at the edge of an emitter or base contact hole where the first small segment of aluminum conductor stripe drops from the surface of the oxide to the surface of the doped silicon. Prior to glassing there is no diffusion problem in this particular region. After the glass firing however, the difficulties resulting from aluminum exchange diffusion at the oxide stepdown are readily observed electrically and also visually. Electrically, the exchange may result in an "open" if the exchange is extreme enough to break the stripe at the step-down. A "short" may result instead if vertical alloying is deep enough to pass through a diffused junction although the stripe continuity is not broken at the step. Shorts and opens due to exchange diffusion are both undesirable from the viewpoint of reducing yield of manufacture. A worse condition is the case of a partial alloying condition in which a transistor is "almost open" or "almost short" because such a device constitutes a reliability risk. Visually, the detrimental exchange diffusion actions may be observed after glassing as dark depressions seen immediately inside the oxide steps and only at the ends of the contact holes where the lands extend over the oxide. There are also observable instances of horizontal protrusion of the aluminum alloy just below the oxide around the region adjacent to the step-down from the elevated land extension over the oxide.

It is known that the maximum solid solubility of silicon in aluminum is 1.59% at the eutectic temperature (577° C.) and at 559 to 568° C. (the usual range of glassing temperatures), the solubility is reduced only slightly to about 1.4%, A reasonable explanation for the troublesome aluminum diffusion problems during glassing may be given. It may be presumed that in the twenty minute interim heating cycle at the glassing temperature there is much diffusion between silicon and aluminum which takes place until the equilibrium conditions are satisfied. The aluminum land area directly over the contact hole on the doped silicon has a ready source of silicon in the bulk upon which it is deposited. Therefore a uniform planar layer of silicon is dissolved from each hole to satisfy the equilibrium needs of the area of aluminum directly over the hole. However the aluminum conductor stripe which is over oxide, has no source of free silicon. Therefore, early in the glassing cycle, the conductor stripe is partly aluminum silicon alloy over the contact hole and partly pure aluminum over the oxide. Because such a state of unstable equilibrium cannot continue, silicon begins to diffuse from the aluminum-silicon alloy up the step and into the pure aluminum over the oxide. The aluminum silicon solution over the contact hole then becomes depleted in silicon content to a level below that demanded by the equilibrium state and therefore more silicon must come from the bulk area. The segment of the aluminum silicon alloy stripe which will again be first to lose to the pure aluminum by the aforementioned diffusion mechanism is that segment adjacent to the oxide step. Silicon replacement from the bulk will therefore take place from below this segment first. As time passes, the aluminum continues to penetrate into the silicon below it and the first aluminum segment next to the step-down becomes deeper and wider. The degree of aluminum penetration, then, is a function of the volume of pure aluminum over the oxide, the glassing temperature and the time at temperature.

The immediate foregoing section of this specification deals mainly with the problems and difficulties surrounding the placement of aluminum lands on silicon devices and the following action is concerned more with the actual prior art and present fabrication of such devices.

Figure 2:
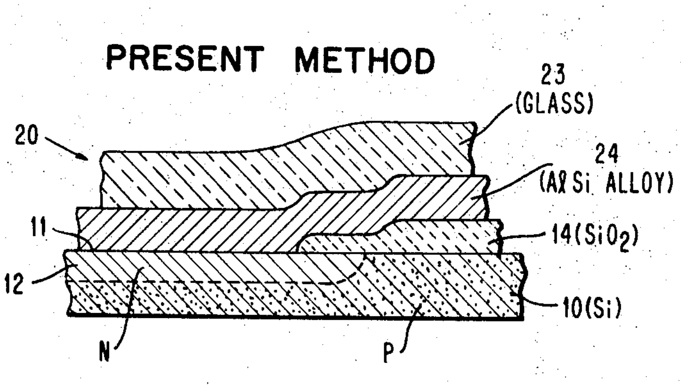
FIG. 2 shows a simliar device involving the process of the present invention whereby an aluminum silicon alloy contact provides a better ohmic contact without deteriorating effects on the surrounding materials.
Figure 3:
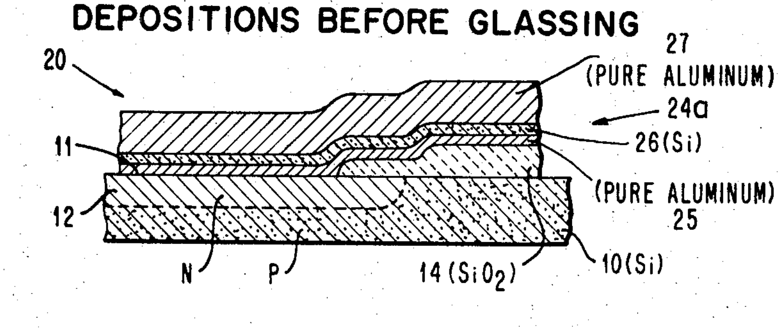
FIG. 3 shows the device of the alternative process involving depositions of silicon between pure aluminum films before glassing to prepare for an alloy contact without exchange from the body of the device.

Referring generally to FIG. 1, a prior art form of semiconductor device is shown with its attendant problem of "necking down" and penetration by aluminum at the site 9. Such a device is to have contact regions formed upon it in an improved fashion as shown in FIGS. 2 and 3 in accordance with the teachings of this invention.

The semiconductor device is fabricated from a wafer 10 of a semiconductor material, for example P-type silicon. A plurality of surface junction regions 12 may be formed on discrete areas of the surface of wafer 10 by conventional techniques. A suitable technique comprises diffusing impurities of the opposite conductivity type N through a mask into discrete areas of wafer 10. Thus, PN junctions are formed at surface junction regions 12. It is to be understood that the disclosed processes of this invention apply as well when the reversed type junction is present with a region 12 of a type P.

After the wafer areas are prepared, a silicon dioxide layer 14 is grown upon the entire upper surface of wafer 10. For purposes of illustration, layer 14 may be about 9,000 A. in thickness. Although other conventional methods may be employed, a preferred oxide technique comprises placing the wafer 10 in an oxidizing atmosphere at an elevated temperature and adding $H_2O$ vapors to the oxidizing atmosphere so as to expedite the growth of layer 14. Layer 14 aids in maintaining the surface of wafer 10 free from ambient impurities and provides an insulation layer over which conductive material may rest other than at depressed land contact areas, one such area 11 being to the left of the "step-down" of layer 14.

The land hole areas in layer 14 are prepared for etching by first placing a pattern of photoresist material over it. A photoresist material is one which upon exposure to light becomes resistant to the action of certain chemicals in selected portions. The photoresist is applied in a conventional manner on all upper surfaces. When dry, a mask, comprising a transparent material with opaque areas thereon, is placed over the wafer 10. Light is passed through the transparent areas of the mask and exposes the photoresist thereunder so that when a developer is applied, the non-exposed is washed away, leaving precisely dimensioned holes in the resist above layer 14.

Then an etchant is used to attack the silicon dioxide layer 14 in land areas without affecting the surface junction region 12 of the silicon wafer thereunder. The exposed area of layer 14 is removed by submerging the device in an etchant such as an ammonium bifluoride buffered solution of hydrofluoric acid. During the etching step, the remaining resist pattern serves to mask the surface of the silicon dioxide layer 14 so as to insure the removal of only the predetermined areas of layer 14, the result is that a hole 20 is extended down to the top 11 of the effective regions. Holes 20 are usually elongated and of connected V or E shapes to provide greater contact area of the surface junction region 12. Once the remaining resist is dissolved by a solvent and the surface junction region 12 is exposed through layer 14, steps may be taken to deposit a pattern of resist to define areas other than contact areas and conductor lead lines and terminals connected thereto. After these steps, a contact metal is deposited on the device.

FIG. 1 shows an ordinary form of pure aluminum 22 deposited onto the surface junction region 12 and leading therefrom. The usual deposition process consists of coating the entire upper surface of the device, as well as the resist thereon with the aluminum contact metal 22 of a thickness of from 5,000 A. to 10,000 A. and then selectively removing the portions of the metal over the resist pattern with the pattern. After the metal coating step, the resist is attacked by a solvent which softens and loosens it so that the contact metal 22 adherent thereto may be peeled away. A deposit of contact metal 22 is left on the surface junction region 12, in order to alloy the contact metal 22 to surface junction region 12, the entire device is placed in a nitrogen atmosphere and heated. A temperature of about 577° C. is necessary to form a eutectic aluminum-silicon alloy.

When there is no underlying pattern of resist, an alternate procedure is used to photoetch the aluminum by a pattern of resist placed thereover and chemically treated to produce the desired conductor and land pattern.

After the aluminum pattern 22 is defined, the entire device surface is passivated with a glass film 23. The glass is applied as a fine frit which must be fused or fired at high temperatures to form a continuous, protective film and this is where ordinarily the diffusion exchange problem is generated as shown in FIG. 1. It is usually required that two 0.75$\mu$ coats be applied and fired for 8 and 12 minutes, respectively. Temperatures lower than 559° C. are inadequate because they result in poor fusion of the frit; temperatures higher than 568° C. magnify the exchange alloying problems at the step-down 9, FIG. 1, where it is seen that at best the negative results include necking down and possible opening of the conductor 22, at point 9, and beneath said point, the alloying of or the junction region 12 with the aluminum to the extent of a possible short. Another shortcoming not illustrated in FIG. 1, but encountered in prior art procedures is the horizontal exchange diffusion of the aluminum with the silicon under the silicon dioxide layer 14 and extending out of the contact hole area 20 and out beyond the aluminum stripe 22. Such horizontal diffusion of aluminum adds to the difficulty caused by the vertical diffusion and is part of the "necking down" loss of aluminum. An explanation for the troublesome exchange problems during glassing is given hereinabove and now there may be presented the remedy residing mainly in providing the auminum silicon alloy conductor material 24, FIG. 2, and 24*a*, FIG. 3, instead of the pure aluminum conductor 22 of FIG. 1. Otherwise, the manner of preparing the wafer 10 and the films thereon is the same as set forth with regard to the showing in FIG. 1.

The aluminum alloy contact formation is by means of evaporating a continuous film prior to photoetching. A typical aluminum contact land, 22, 24 or 24*a* is about 5,000 A. to 7,000 A. in thickness. The widths of such lands may vary from .3 to 1.4 mils, depending on the type of the transistor. The aluminum is ordinarily deposited above in a blanket film using one of several varieties of the high-low evaporation processes. In this procedure, a thin flash of aluminum is put onto the wafer which is heated to a very high temperature of 300 to 600° C. to enhance the formation of a positive metallurgical bond to the silicon. The bulk of the aluminum is put on the wafer after it has cooled to a lower temperature of about 100 to 200° C. Low temperature deposition of the bulk of the aluminum insures a fine-grained metal film which may be etched with greater definition through a photoresist process. The exchange diffusion problems do not occur during the application of the aluminum, but it is quite definite that the reactions between aluminum and silicon are a direct consequence of the glassing heat cycle. A remedy for this diffusion problem is found by application of the present invention wherein a small a mount of silicon is deposited and evaporated concurrently with either or both of the aluminum deposition steps at high heat and at low temperature. The application of evaporated silicon is carried on by causing the holder for the heated silicon to be brought very closely to the surface of the doped silicon which is concurrently receiving the evaporated aluminum. By depositing a homogeneous alloy of aluminum containing the small amount of silicon, the equilibrium state is pre-satisfied at the glassing temperature and does not require further solution of bulk silicon and hence there is no penetration. Since aluminum has a vapor pressure higher than silicon, there is a preferential distillation of aluminum before silicon as in FIG. 3 which must be taken care of to achieve the results of FIG. 2 so that the resultant product is not essentially a layer of silicon upon a layer of aluminum. This is taken care of partly by the closeness with which the silicon holder is positioned to cause direct evaporation upon the silicon surface and controlled evaporation to be not too early or too fast. The co-deposition of aluminum and silicon from two different sources spaced differentially to blend the evaporants on the substrate is a successful method of avoiding the step-down penetration alloying mentioned hereinbefore. The timing of the approach of the silicon evaporant holder to the silicon surface is gauged during the 8 and 12 minute periods of aluminum deposition and in this fashion so that the time of co-deposition is arranged to cause an alloying of two to three percent of silicon with the aluminum deposition.

In order to provide well-controlled sources for the aluminum and silicon, it is desirous that the evporation of the silicon be prevented from being too early or too fast, and also prevent it from being too late or too slow.

Although in one mode of control the silicon is co-deposited continuously, slowly and uniformly to arrive at the alloy formation 24 of FIG. 2, it is also possible to control deposition of silicon rapidly so that the laminar appearance of conductor 24*a*, FIG. 3, prevails. This is accomplished because the thin flash film 25 of about 10–2,000 A. is an initial deposit of pure aluminum. It is followed by a rapid silicon deposition of from 200–1,000 A. deposition of silicon to provide as much as 12% by weight of the final conductor thickness 24*a* which is more than ample for the aluminum exchange needs. Along with the silicon deposition and thereover is the bulk conductor aluminum deposition 27 which is about 5,000 A. During the step of alloying the contact metal 25 to the surface junction region 12 there will be some diffusion exchange between layers 25, 26, and 27. However, it is later during the glassing step that exchange between films 25, 26, and 27 prevents the exterior exchanges as at point 9 in FIG. 1, and thus overcomes the shortcomings of the prior art. The intermediate silicon film 26 serves as a silicon source to satisfy the solid solubility requirements of all segments of the aluminum contacts, stripes and terminals while preserving the conductivity thereof.

After the aluminum film has been deposited, the coating is subjected to a photoresist and etching process for removal of all conductive material except that which serves as lands, terminals and conductor lines. Once the aluminum areas have been defined, the whole effective area is glassed. The glass is usually applied as a fine frit which is fused or fired at a high temperature to form a continuous protective film. Now, as shown in FIGS. 2 and 3, there is no diffusion exchange problem during glassing.

While the invention has been particularly shown and described with reference to preferred embodiments, it will be understood by those skilled in the art that various changes in form and detail may be made therein without departing from the spirit and scope of the invention.

What is claimed is:

1. A compound film for attaching an electrode to a semiconductor body, comprising:
   a metal base film comprising an aluminum-silicon alloy, said alloy having no more than about 3% silicon, and
   insulating films in contact with opposite surfaces of said metal base film, said insulating films including a silicon oxide film located on said semiconductor body and a passivating film located on said metal base film, wherein said metal base film extends through said silicon oxide film to contact said semiconductor body.

2. The film of claim 1, where said semiconductor body is silicon, and said passivating film is comprised of a glass.

References Cited

UNITED STATES PATENTS

| | | | |
|---|---|---|---|
| 3,158,504 | 11/1964 | Anderson | 117—227X |
| 3,361,592 | 1/1968 | Quetsch, Jr., et al. | 117—217X |

ALFRED L. LEAVITT, Primary Examiner

C. K. WEIFFENBACH, Assistant Examiner

U.S. Cl. X.R.

29—195; 117—212, 227; 317—234